US012581681B2

(12) United States Patent
Tsao et al.

(10) Patent No.: US 12,581,681 B2
(45) Date of Patent: Mar. 17, 2026

(54) SEMICONDUCTOR DEVICE METHOD FOR FORMING THE SAME

(71) Applicant: MEDIATEK INC., Hsinchu City (TW)

(72) Inventors: Po-Chao Tsao, Hsinchu City (TW); Hsien-Hsin Lin, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 532 days.

(21) Appl. No.: 18/064,431

(22) Filed: Dec. 12, 2022

(65) Prior Publication Data

US 2023/0223465 A1 Jul. 13, 2023

Related U.S. Application Data

(60) Provisional application No. 63/297,266, filed on Jan. 7, 2022.

(51) Int. Cl.
| | |
|---|---|
| *H10D 30/43* | (2025.01) |
| *H10D 30/01* | (2025.01) |
| *H10D 30/67* | (2025.01) |
| *H10D 62/10* | (2025.01) |
| *H10D 64/23* | (2025.01) |

(52) U.S. Cl.
CPC ........... *H10D 30/43* (2025.01); *H10D 30/014* (2025.01); *H10D 30/6735* (2025.01); *H10D 62/121* (2025.01); *H10D 64/258* (2025.01)

(58) Field of Classification Search
CPC .. H10D 30/43; H10D 30/014; H10D 30/6735; H10D 62/121; H10D 64/258; H10D 30/6757; H10D 30/797; H10D 64/017;

H10D 62/822; H10D 62/364; H10D 62/116; H10D 62/151; H10D 30/024; H10D 30/0245; H10D 30/6219; H10D 30/62; B82Y 10/00
See application file for complete search history.

(56) References Cited

U.S. PATENT DOCUMENTS

| | | | |
|---|---|---|---|
| 2018/0212039 A1 | 7/2018 | Chao et al. | |
| 2019/0035888 A1* | 1/2019 | Wu .................. | H01L 21/02483 |
| 2021/0408283 A1 | 12/2021 | Agrawal et al. | |

FOREIGN PATENT DOCUMENTS

| | | |
|---|---|---|
| TW | 202201796 A | 1/2022 |

OTHER PUBLICATIONS

Chinese language office action dated Aug. 30, 2023, issued in application No. TW 112100457.

* cited by examiner

*Primary Examiner* — Mohammad A Rahman
(74) *Attorney, Agent, or Firm* — McClure, Qualey & Rodack, LLP

(57) ABSTRACT

A semiconductor device is provided. The semiconductor device includes a substrate, a fin structure and an epitaxial source/drain structure. The substrate includes a substrate layer and an insulator layer on the substrate layer. The fin structure is formed over the substrate, wherein the fin structure includes a gate structure and channel layers wrapped by the gate structure. The epitaxial source/drain structure is connected to the channel layers, wherein a bottom portion of the epitaxial source/drain structure is in contact with the insulator layer of the substrate.

31 Claims, 10 Drawing Sheets

SEMICONDUCTOR DEVICE METHOD FOR FORMING THE SAME

CROSS REFERENCE TO RELATED APPLICATIONS

This application claims the benefit of U.S. Provisional Application No. 63/297,266, filed on Jan. 7, 2022, the entirety of which is incorporated by reference herein.

BACKGROUND OF THE INVENTION

Field of the Invention

The present invention relates to a semiconductor device and method for forming the same, and, in particular, to a fin field-effect transistor with a reduced substrate leakage and method for forming the same.

Description of the Related Art

In recent years, advanced integrated circuit (IC) devices have been become increasingly multifunctional and have been scaled down in size. Although the scaling down process generally increases production efficiency and lowers associated costs, it has also increased the complexity of processing and manufacturing IC devices. For example, Fin Field-Effect Transistors (FinFETs) have been introduced to replace planar transistors. Among these FinFETs, gate-all-around (GAA) structures such as nanosheet metal-oxide-semiconductor field-effect transistors (MOSFET) have been developed to possess excellent electrical characteristics, such as improved power performance and area scaling compared to the current FinFET technologies.

Although existing semiconductor structures including nanosheet transistors and methods for manufacturing the same have been adequate for their intended purposes, they have not been entirely satisfactory in all respects. For example, extra implant processes are required to implant desired dopants into the bottom of the gate structure of GAA structures landing on the substrate to reduce the substrate leakage problem.

Thus, a novel semiconductor device is desirable to improve the substrate leakage problem.

BRIEF SUMMARY OF THE INVENTION

An embodiment of the present invention provides a semiconductor device. The semiconductor device includes a substrate, a fin structure and an epitaxial source/drain structure. The substrate includes a substrate layer and an insulator layer on the substrate layer. The fin structure is formed over the substrate, wherein the fin structure includes a gate structure and channel layers wrapped by the gate structure. The epitaxial source/drain structure is connected to the channel layers, wherein a bottom portion of the epitaxial source/drain structure is in contact with the insulator layer of the substrate.

In addition, an embodiment of the present invention provides a semiconductor device. The semiconductor device includes a substrate, a fin structure and an epitaxial source/drain structure. The substrate includes a substrate layer and an insulator layer on the substrate layer. The fin structure is formed over the substrate, wherein the fin structure includes a gate structure and channel layers wrapped by the gate structure. The epitaxial source/drain structure is connected to the channel layers, wherein the epitaxial source/drain structure is isolated from the substrate layer of the substrate by the insulator layer.

Furthermore, an embodiment of the present invention provides method for forming a semiconductor device. The method includes providing a semiconductor-on-insulator (SOI) substrate comprising a bottom substrate layer, a middle insulator layer and a top semiconductor layer containing first semiconductor atoms. The method includes epitaxially growing a semiconductor capping layer on the top semiconductor layer. The semiconductor capping layer contains the first semiconductor atoms and second semiconductor atoms. The second semiconductor atoms are different from the first semiconductor atoms. The method includes performing a thermal process to drive the second semiconductor atoms of the semiconductor capping layer into the top semiconductor layer so that the semiconductor capping layer and the top semiconductor layer collectively form a first sacrificial layer. The method includes epitaxially growing an alternative stack of channel layers and second sacrificial layers on the first sacrificial layer. The method includes patterning the middle insulator layer, the first sacrificial layer and the alternative stack to form a fin structure. The method includes removing portions of the fin structure until the middle insulator layer is exposed to form source/drain recesses. The method includes forming epitaxial source/drain structures in the source/drain recesses.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figures 1, 1A:
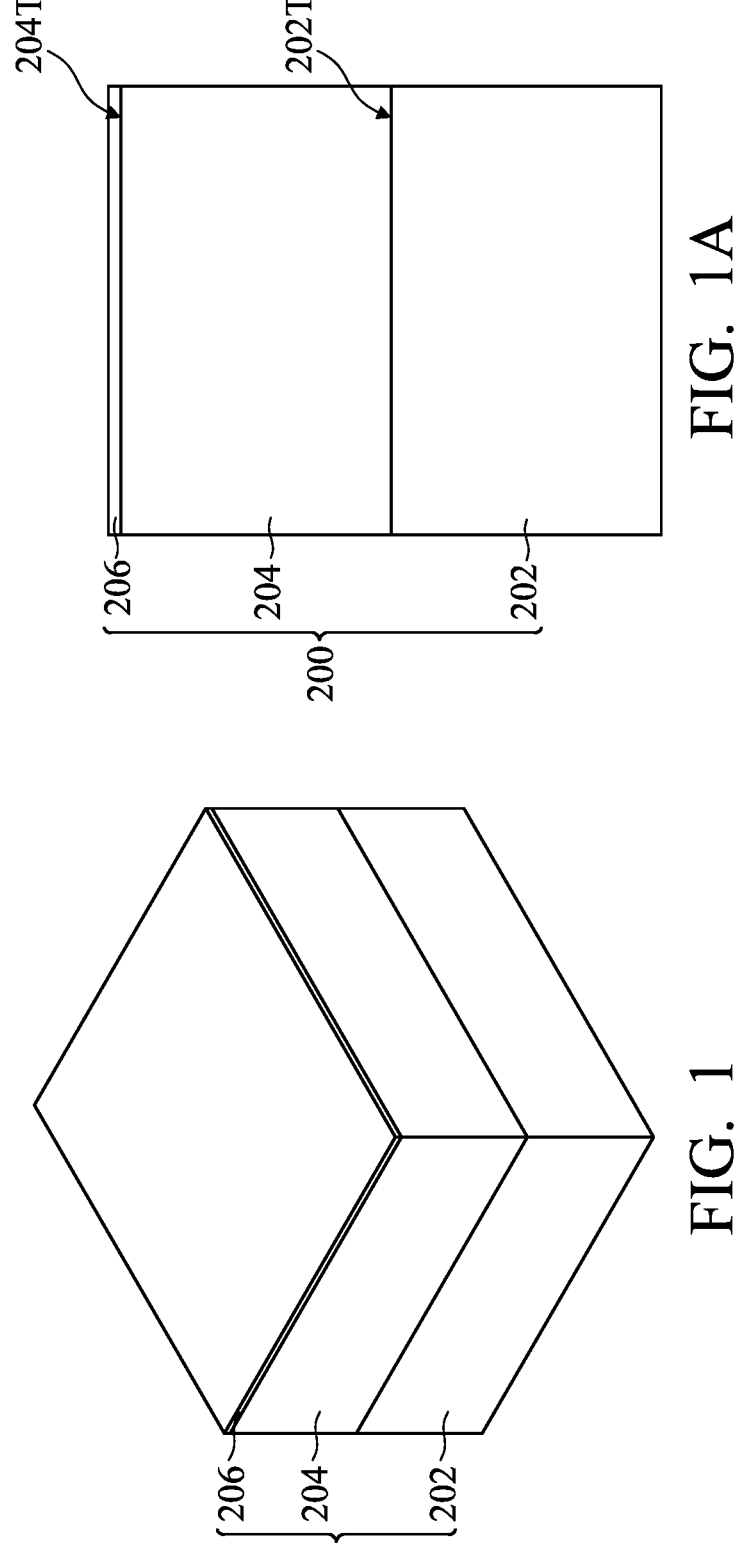
FIG. 1 illustrates a perspective view of an intermediate stage of forming a semiconductor device in accordance with some embodiments of the disclosure.
FIG. 1A illustrates a cross-sectional view of an intermediate stage of forming the semiconductor device shown along line A-A' in FIG. 1 in accordance with some embodiments.

The following description is made for the purpose of illustrating the general principles in accordance with some embodiments of the disclosure and should not be taken in a limiting sense. The scope in accordance with some embodiments of the disclosure is best determined by reference to the appended claims.

The inventive concept is described fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments and may be implemented in various forms. Accordingly, the exemplary embodiments are provided only to disclose the inventive concept and let those skilled in the art know the category of the inventive concept. Also, the drawings as illustrated are only schematic and are non-limiting. In the drawings, the size of some of the elements may be exaggerated for illustrative purposes and not drawn to scale. The dimensions and the relative dimensions do not correspond to actual dimensions in the practice in accordance with some embodiments of the disclosure.

Embodiments provide a semiconductor device, such as a fin field-effect transistors (FinFETs) comprising a gate-all around transistor (GAA) device. The semiconductor device includes a fin structure formed on a semiconductor-on-insulator (SOI) substrate comprising a top semiconductor layer of first semiconductor atoms (e.g. silicon (Si)), a middle insulator layer, and a bottom substrate layer. Before forming an alternative stack of channel layers and sacrificial layers of a fin structure, an epitaxially growth process of a semiconductor capping layer containing the first semiconductor atoms and second semiconductor atoms (e.g. germanium (Ge)) and a subsequent thermal process are performed to drive second semiconductor atoms of the semiconductor capping layer into the top semiconductor layer, allowing the semiconductor capping layer and the top semiconductor layer collectively form another sacrificial layer having a composition (e.g. the Ge concentration (atomic percent)) that is similar to, or the same as, a composition of sacrificial layers of the alternative stack of the fin structure. The sacrificial layers, which are formed from both the top semiconductor layer and the alternative stack, are then replaced with a gate structure wrapping the channel layers. The resulting gate structure and epitaxial source/drain structures can be directly formed on the middle insulator layer of the SOI substrate without being in contact with any semiconductor layer except for channel layers of the fin structure. Therefore, the substrate leakage problem can be improved without extra dopants implanted into bottoms of the gate structure and epitaxial source/drain structures.

Figure 6A:
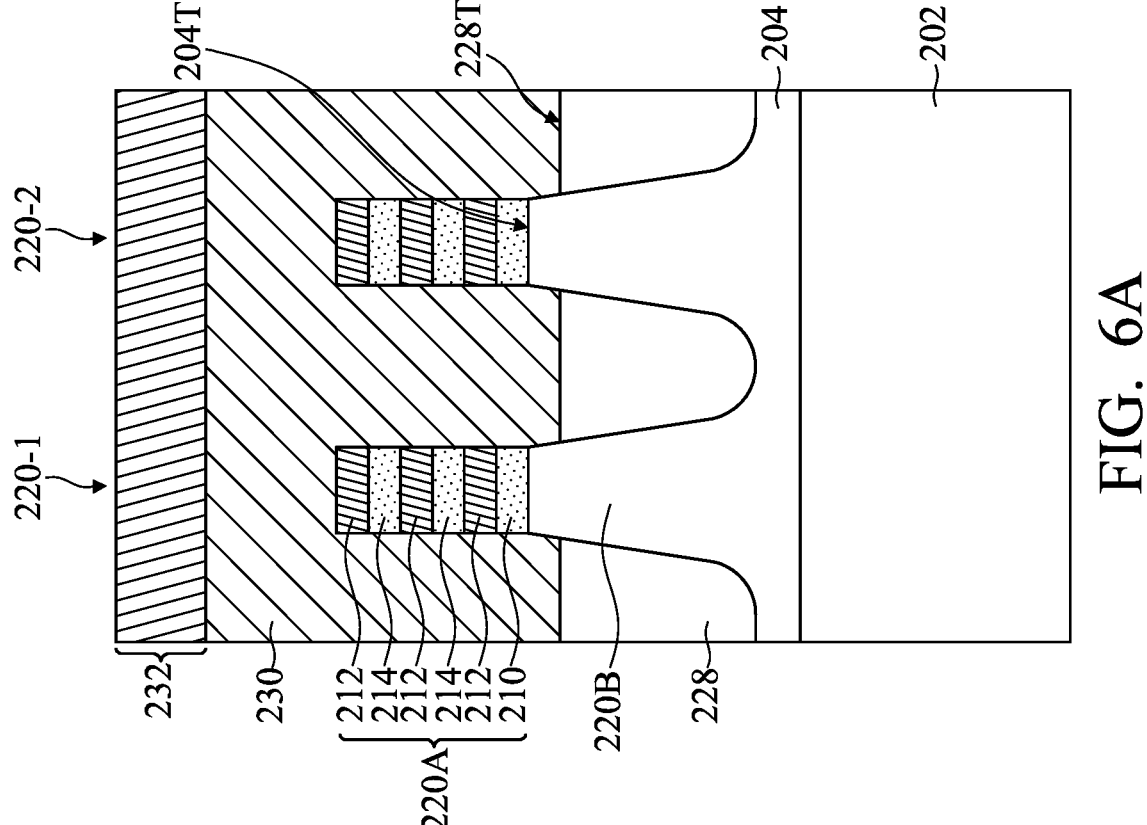
FIG. 6A illustrates a cross-sectional view of an intermediate stage of forming the semiconductor device shown along line A-A' in FIG. 5 in accordance with some embodiments.
Figures 6B, 6C:
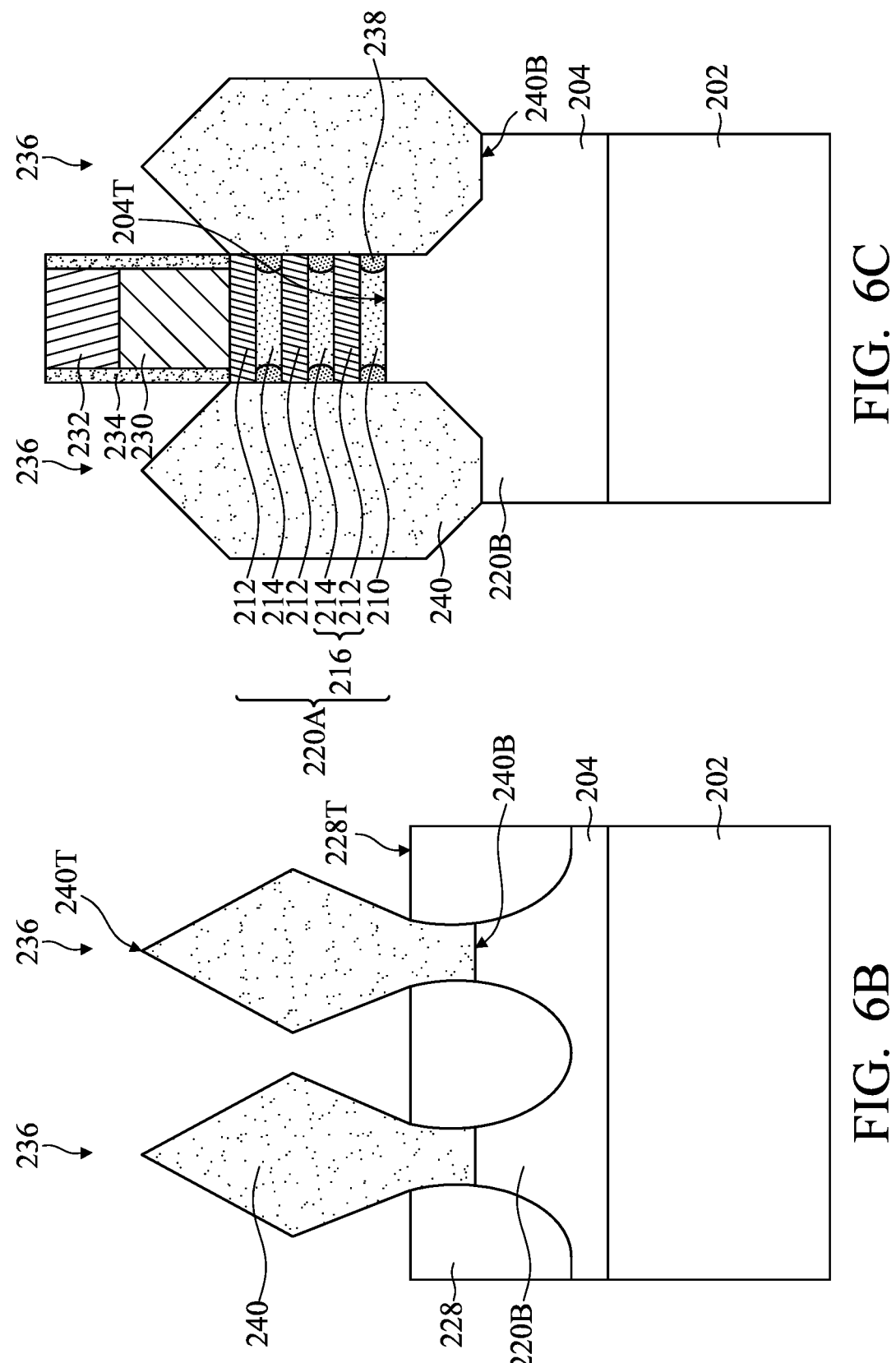
FIG. 6B illustrates a cross-sectional view of an intermediate stage of forming the semiconductor device shown along line B-B' in FIG. 5 in accordance with some embodiments.
FIG. 6C illustrates a cross-sectional view of an intermediate stage of forming the semiconductor device shown along line C-C' in FIG. 5 in accordance with some embodiments.
Figure 7A:
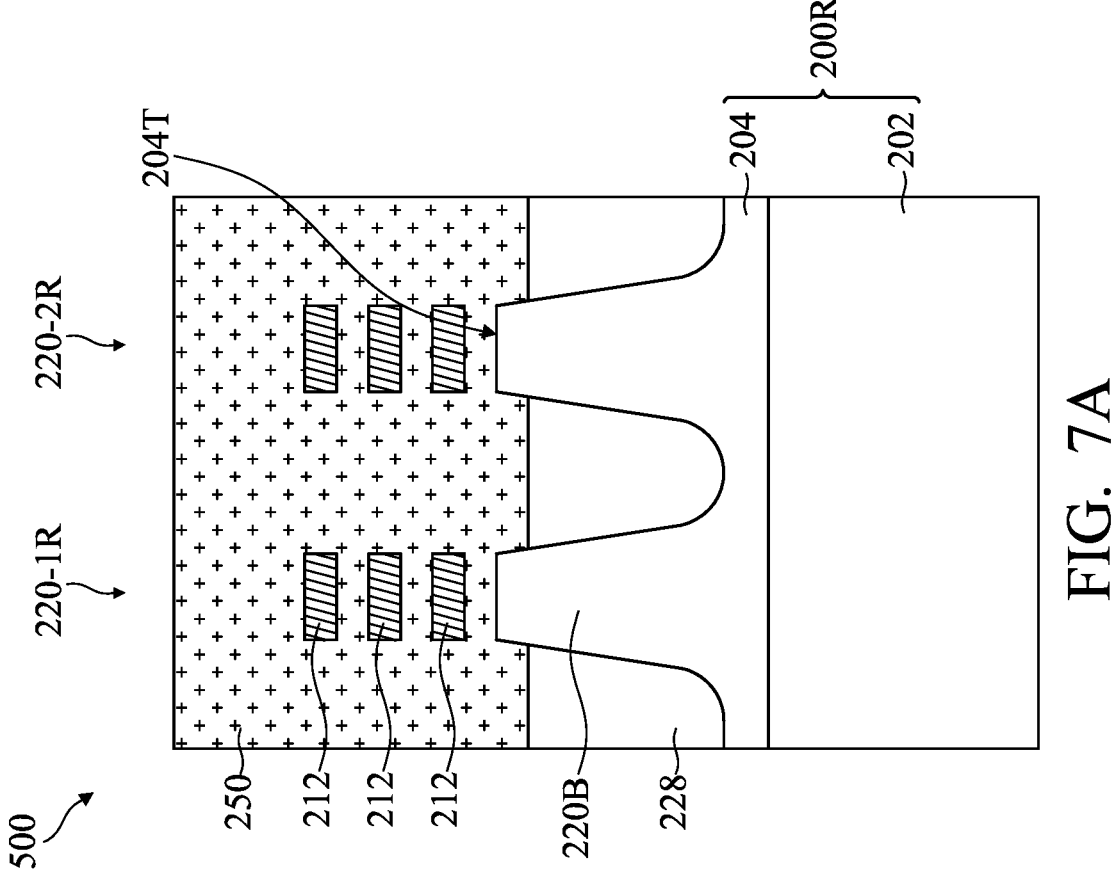
FIG. 7A illustrates a cross-sectional view of an intermediate stage of forming the semiconductor device shown along line A-A' in FIG. 5 in accordance with some embodiments.
Figures 7B, 7C:
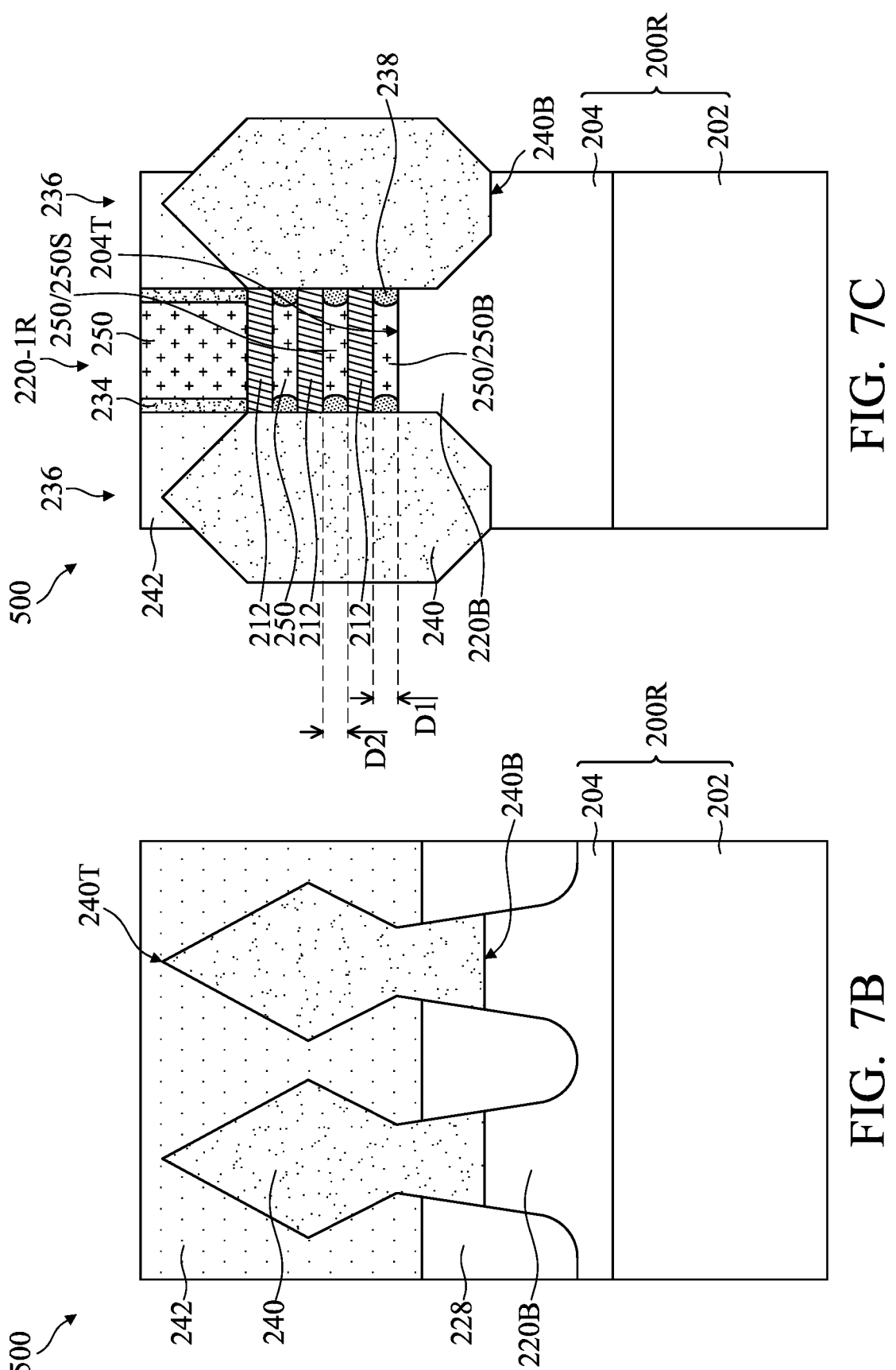
FIG. 7B illustrates a cross-sectional view of an intermediate stage of forming the semiconductor device shown along line B-B' in FIG. 5 in accordance with some embodiments.
FIG. 7C illustrates a cross-sectional view of an intermediate stage of forming the semiconductor device shown along line C-C' in FIG. 5 in accordance with some embodiments.

FIGS. 1-5 illustrate perspectives view of intermediate stages of forming a semiconductor device 500 in accordance with some embodiments of the disclosure. FIGS. 1A, 2A, 5A, 4A and 5A illustrate cross-sectional views of intermediate stages of forming the semiconductor device 500 shown along line A-A' in FIGS. 1-5 in accordance with some embodiments. FIGS. 6A and 7A illustrate cross-sectional views of subsequent intermediate stages of forming the semiconductor device 500 in a channel region shown along line A-A' in FIG. 5 in accordance with some embodiments. FIGS. 6B and 7B illustrate cross-sectional views of subsequent intermediate stages of forming the semiconductor device 500 of a source/drain region shown along line B-B' in FIG. 5 in accordance with some embodiments. FIGS. 6C and 7C illustrate cross-sectional views of subsequent intermediate stages of forming the semiconductor device 500 along a first fin shown along line C-C' in FIG. 5 in accordance with some embodiments. In addition, the present disclosure may repeat reference numerals and/or letters in the various examples.

As shown in FIGS. 1 and 1A, a semiconductor-on-insulator (SOI) substrate 200 is provided. The SOI substrate 200 comprises a bottom substrate layer 202, a middle insulator layer 204 and a top semiconductor layer 206. The middle insulator layer 204 formed entirely covering a top surface 202T of the bottom substrate layer 202 may comprise a buried oxide (BOX) layer or a silicon oxide layer. The top semiconductor layer 206 formed entirely covering a top surface 204T of the middle insulator layer 204 may contain first semiconductor atoms. For example, the top semiconductor layer 206 comprises silicon (Si) or silicon germanium (SiGe), and the first semiconductor atoms are silicon (Si). For example, the top semiconductor layer 206 only contains the first semiconductor atoms (e.g. Si). In some embodiments, the top semiconductor layer 206 is thinner than the bottom substrate layer 202 and the middle insulator layer 204. For example, a thickness of the top semiconductor layer 206 may be from about 8 nm to about 12 nm. In some embodiments, the bottom substrate layer 202 and the top semiconductor layer 206 comprise the same composition.

Figure 2A:
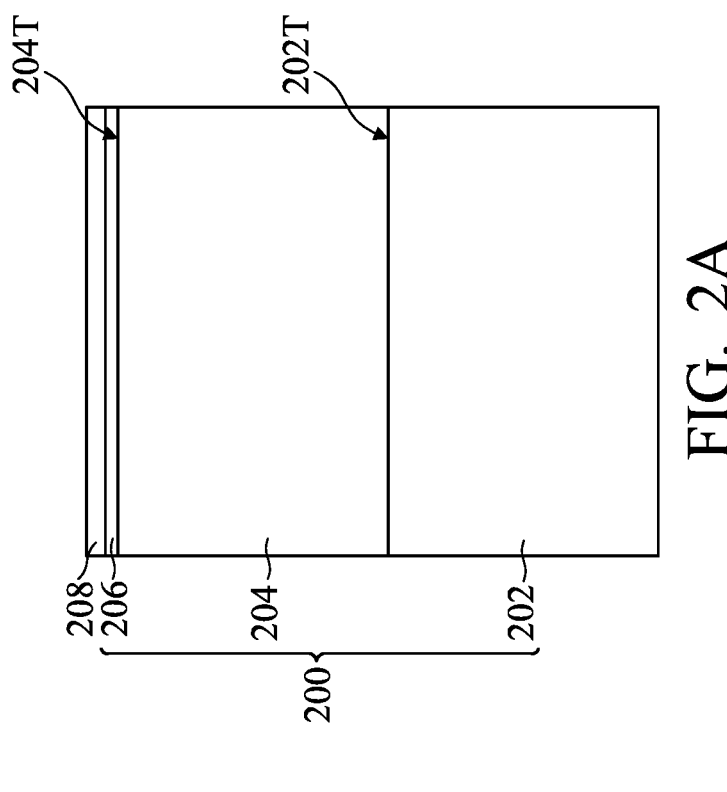
FIG. 2A illustrates a cross-sectional view of an intermediate stage of forming the semiconductor device shown along line A-A' in FIG. 3 in accordance with some embodiments.
Figure 2:
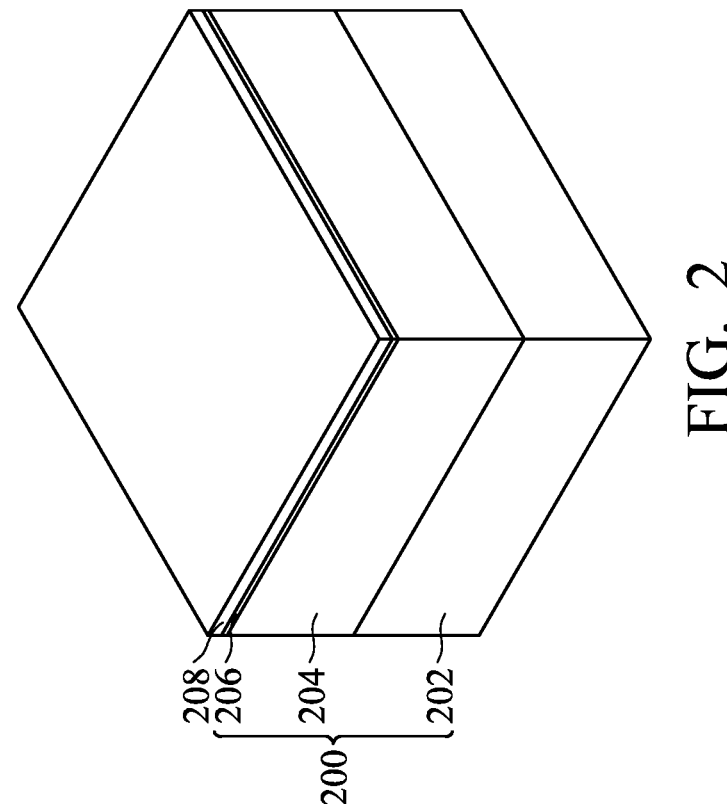
FIG. 2 illustrates a perspective view of an intermediate stage of forming a semiconductor device in accordance with some embodiments of the disclosure.

As shown in FIGS. 2 and 2A, next, a semiconductor capping layer 208 is epitaxially grown on the top semiconductor layer 206. In some embodiments, the semiconductor capping layer 208 contains the first semiconductor atoms and second semiconductor atoms different from the first semiconductor atoms. For example, the semiconductor capping layer 208 comprises a silicon germanium (SiGe) layer, the first semiconductor atoms are silicon (Si) and the second semiconductor atoms are germanium (Ge). For example, the semiconductor capping layer 208 only contains the first semiconductor atoms (e.g. Si) and the second semiconductor atoms (e.g. Ge). In some embodiments, a composition of the semiconductor capping layer 208 is the same as that of subsequently formed second sacrificial layers 214. In some embodiments, a concentration (atomic percent) of the second semiconductor atoms of the semiconductor capping layer 208 is greater than that of subsequently formed second sacrificial layers 214. For example, when the semiconductor capping layer 208 is a silicon germanium (SiGe) layer, germanium (Ge) concentration (atomic percent) of the semiconductor capping layer 208 may be about 25-55%, such as 50%. In some embodiments, a thickness of the semiconductor capping layer 208 is the same or thicker that of the top semiconductor layer 206. For example, the thickness of the semiconductor capping layer 208 is from about 8 nm to about 20 nm. In some embodiments, the germanium-containing layer 208 is epitaxially grown by a molecular beam epitaxy (MBE) process, a metalorganic chemical vapor deposition (MOCVD) process, and/or other suitable epitaxial growth processes.

Figure 3A:
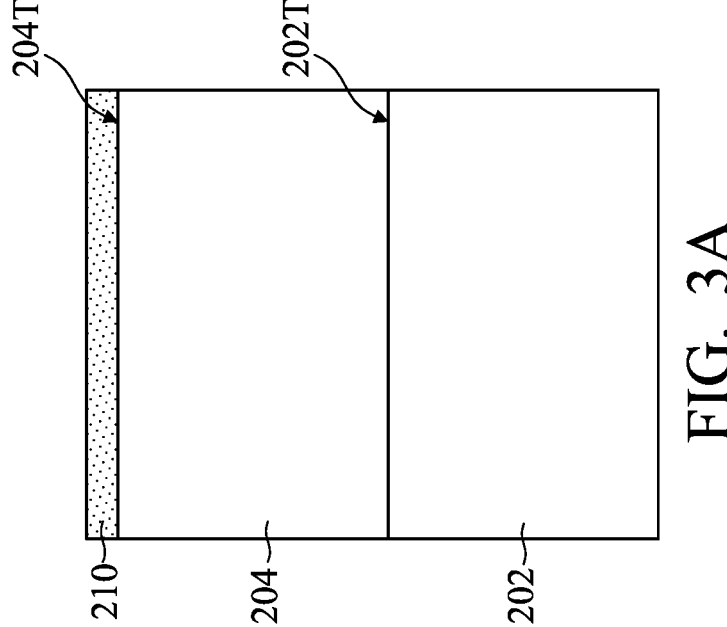
FIG. 3A illustrates a cross-sectional view of an intermediate stage of forming the semiconductor device shown along line A-A' in FIG. 3 in accordance with some embodiments.
Figure 3:
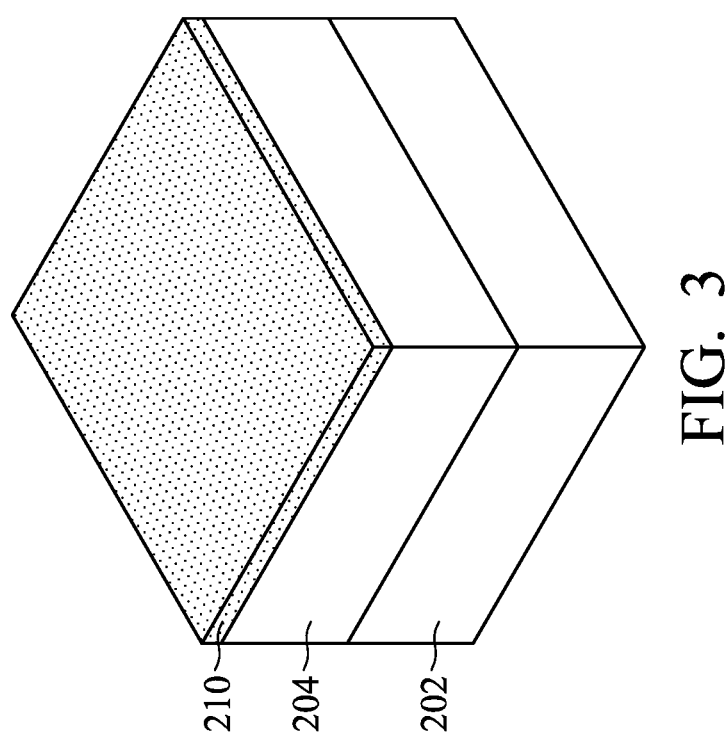
FIG. 3 illustrates a perspective view of an intermediate stage of forming a semiconductor device in accordance with some embodiments of the disclosure.

As shown in FIGS. 3 and 3A, next, a thermal process is performed to drive the second semiconductor atoms (e.g. Ge atoms) of the semiconductor capping layer 208 (FIGS. 2 and 2A) into the top semiconductor layer 206 (FIGS. 2 and 2A). In addition, the semiconductor capping layer 208 and the top semiconductor layer 206 may have a uniform concentration of second semiconductor atoms (e.g. Ge atoms). After performing the thermal process, the semiconductor capping layer 208 and the top semiconductor layer 206 collectively form a first sacrificial layer 210. The first sacrificial layer 210 contains the first semiconductor atoms and second semiconductor atoms different from the first semiconductor atoms. For example, the first sacrificial layer 210 comprises a silicon germanium (SiGe) layer, the first semiconductor atoms are silicon (Si) and the second semiconductor atoms are germanium (Ge). In some embodiments, a concentration (e.g. Ge concentration) (atomic percent) of the second semiconductor atoms of the semiconductor capping layer 208 (FIGS. 2 and 2A) is greater than that of the first sacrificial layer 210. For example, when the first sacrificial layer 210 is a silicon germanium (SiGe) layer, germanium (Ge) concentration (atomic percent) of the first sacrificial layer 210 is about 20-30%, such as 25%.

In some other embodiments, when the top semiconductor layer 206 of the SOI substrate 200 and the subsequently formed second sacrificial layers 214 both contain the first semiconductor atoms and second semiconductor atoms, such as a silicon germanium (SiGe) layer. The top semiconductor layer 206 may serve as the first sacrificial layer, and the processes used to form the first sacrificial layer 210 can be omitted.

Figures 4, 4A:
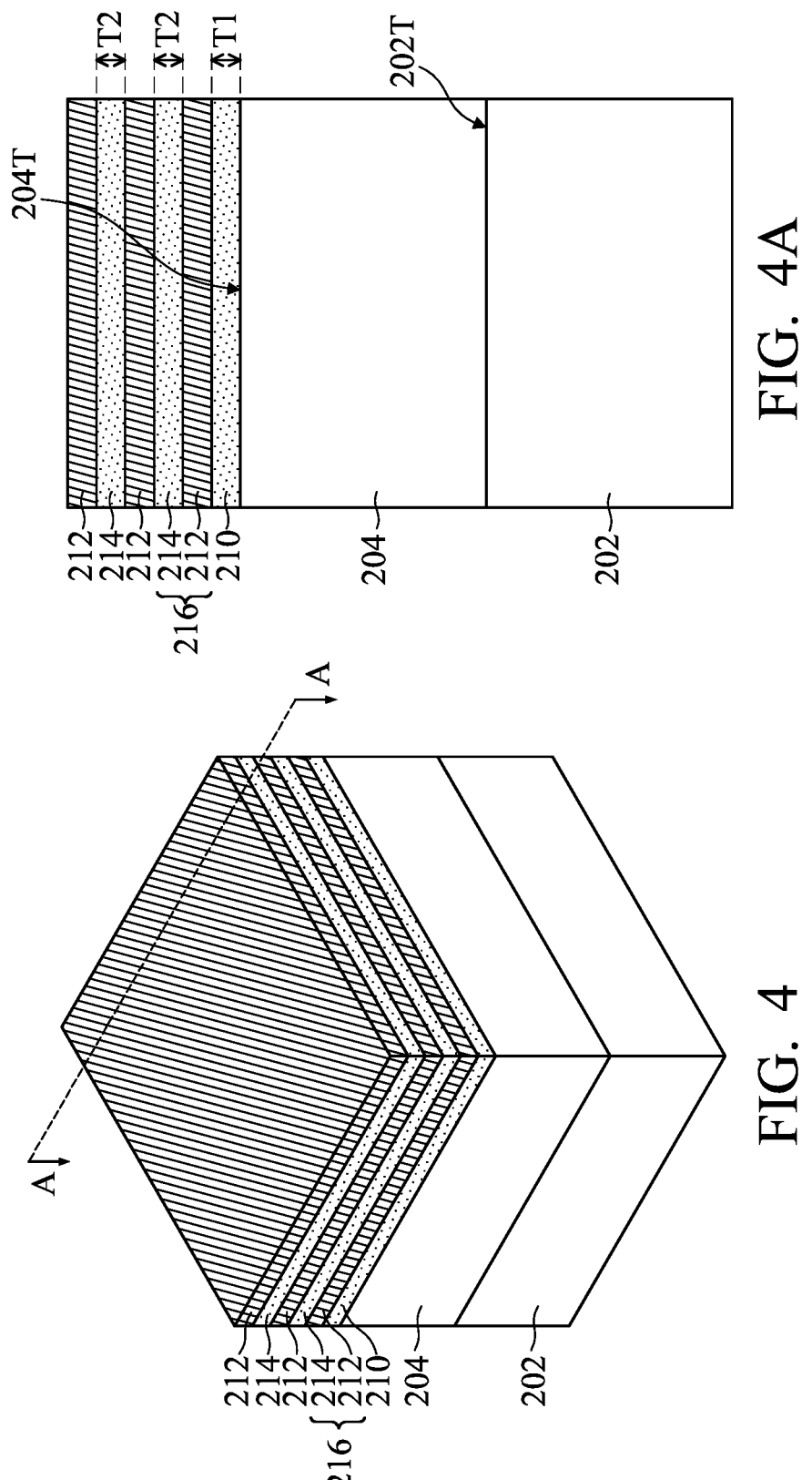
FIG. 4 illustrates a perspective view of an intermediate stage of forming a semiconductor device in accordance with some embodiments of the disclosure.
FIG. 4A illustrates a cross-sectional view of an intermediate stage of forming the semiconductor device shown along line A-A' in FIG. 4 in accordance with some embodiments.

As shown in FIGS. 4 and 4A, next, an alternative stack 216 of channel layers 212 and second sacrificial layers 214 is epitaxially grown on the first sacrificial layer 210. The channel layers 212 are interposed by the first sacrificial layer 210 and the second sacrificial layers 214. The first sacrificial layer 210 and the second sacrificial layers 214 define spacing between adjacent channel layers 212 and would be subsequently removed. In some embodiments, the first sacrificial layer 210 and the second sacrificial layers 214 may be formed of the same semiconductor materials and have the same thickness. The first sacrificial layer 210 and the second sacrificial layers 214 may both contain the first semiconductor atoms and the second semiconductor atoms. The first sacrificial layer 210 may have a first composition, and the second sacrificial layers 214 may have a second composition. The second composition is the same as the first composition. For example, the first sacrificial layer 210 and the second sacrificial layers 214 may be silicon germanium (SiGe) layers having the same Ge concentration. In some embodiments, the first sacrificial layer 210 has a first thickness $T1$, and the second sacrificial layers 214 have a second thickness $T2$, which is the same as the first thickness $T1$. For example, the first thickness $T1$ and the second thickness $T2$ are from about 16 nm to about 32 nm. The first thickness $T1$ and the second thickness $T2$ may have desired ranges according to the device performance.

As shown in FIGS. 4 and 4A, a bottommost layer of the channel layers 212 is in contact with the first sacrificial layer 210 after epitaxially growing the alternative stack 216 of the channel layers 212 and the second sacrificial layers 214. In some embodiments, the channel layers 212 may contain the first semiconductor atoms (e.g. Si) but not the second semiconductor atoms (e.g. Ge). The channel layers 212 have a third composition. The third composition is different from the first composition of the first sacrificial layer 210 and the second composition of the second sacrificial layers 214. For example, when the first sacrificial layer 210 and the second sacrificial layers 214 are silicon germanium (SiGe) layers, the channel layers 212 are silicon (Si) layers. In addition, the first composition and the third composition (or the second composition and the third composition) may have different oxidation rates and/or etch selectivity. In some embodiments, the alternative stack 216 comprises a first number of channel layers 212 and a second number of second sacrificial layers 214, and the first number is different from the second number. For example, the first number is greater than the second number. For example, a difference between the first number and the second number is 1. In some embodiments, the total number of first sacrificial layers 210 and second sacrificial layers 214 is the same as the number of channel layers 212. It should be noted that although three channel layers 212 and two second sacrificial layers 214 are formed in the figures, the alternative stack 216 may include more or fewer channel layers 212 and second sacrificial layers 214. For example, the alternative stack 216 may include from two to ten channel layers 212 and from one to nine second sacrificial layers 214 individually, depending on the desired number of channel layers for forming transistors. In some embodiments, the channel layers 212 have a uniform thickness. In addition, the thickness of the channel layers 212 may have a desired range according to the device performance. For example, the thickness of the channel layers 212 may be similar to the first thickness $T1$ of the first sacrificial layer 210 and the second thickness $T2$ of the second sacrificial layers 214. In some embodiments, the channel layers 212 and the second sacrificial layers 214 are epitaxially grown using a molecular beam epitaxy (MBE) process, a metalorganic chemical vapor deposition (MOCVD) process, or another suitable epitaxial growth process.

As shown in FIGS. 5 and 5A-5C, next, the middle insulator layer 204, the first sacrificial layer 210 and the alternative stack 216 are patterned to form fin structures 220-1 and 220-2 protruding from the SOI substrate 200 and a trench 224 between the fin structures 220-1 and 220-2. The fin structures 220-1 and 220-2 may be used to form GAA devices having different conductivity types or the same conductivity type. Each of the fin structures 220-1 and 220-2 comprises an upper portion 220A and a base portion 220B. The upper portion 220A is formed from patterning the first sacrificial layer 210 and the alternative stack 216. The base portion 220B is formed by patterning the middle insulator layer 204 (e.g. the top portion of the top portion) of the SOI substrate 200. That is to say, the base portion 220B is formed of the middle insulator layer 204.

Figures 5, 5A:
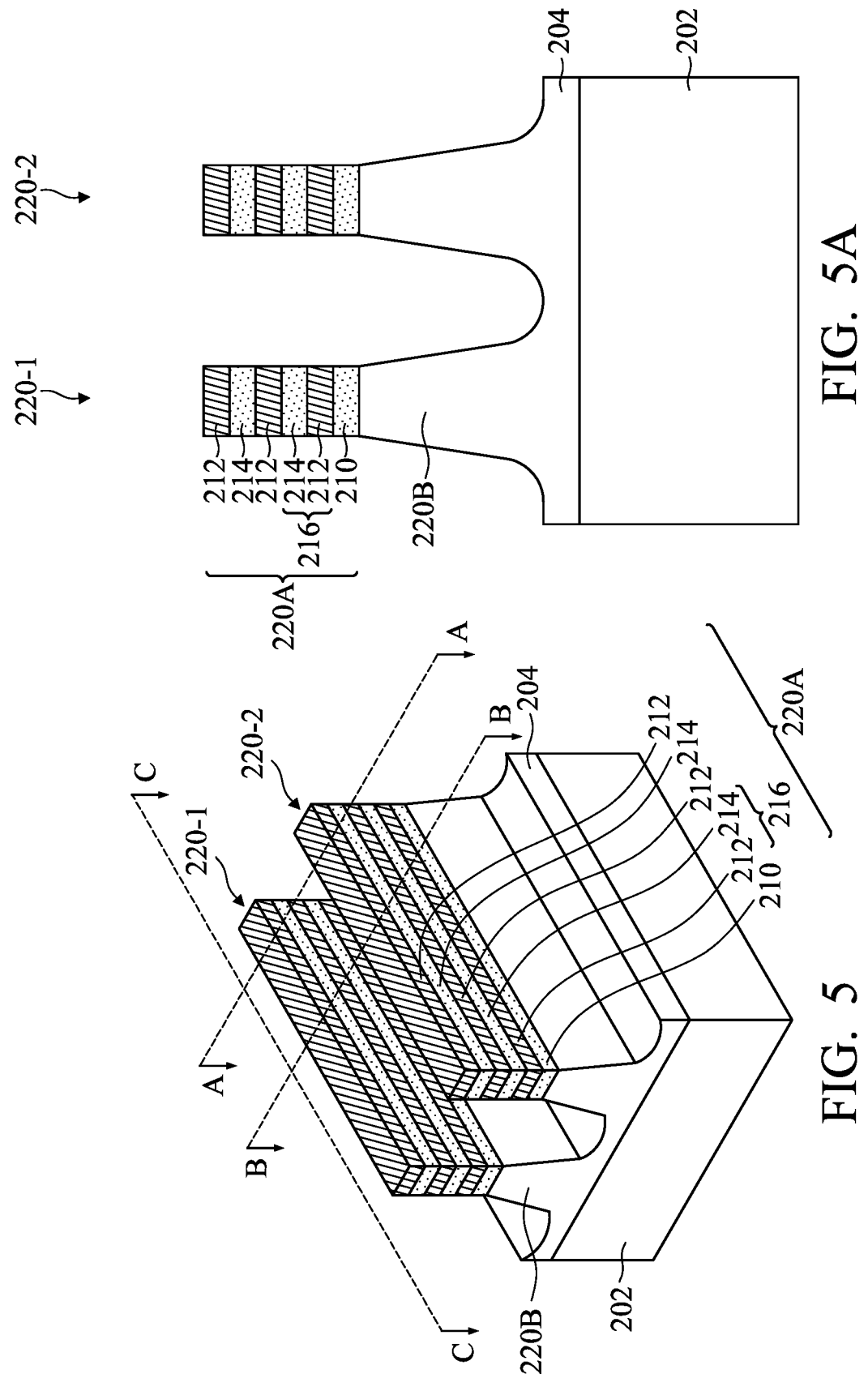
FIG. 5 illustrates a perspective view of an intermediate stage of forming a semiconductor device in accordance with some embodiments of the disclosure.
FIG. 5A illustrates a cross-sectional view of an intermediate stage of forming the semiconductor device shown along line A-A' in FIG. 5 in accordance with some embodiments.
Figure 5C:
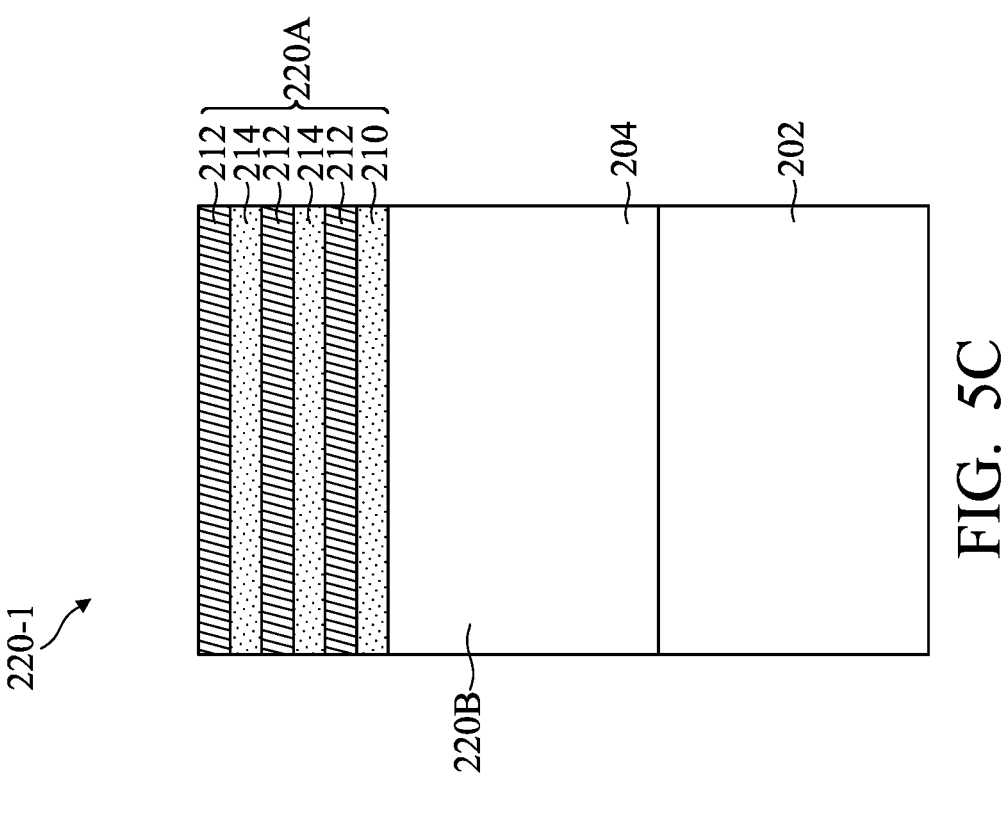
FIG. 5C illustrates a cross-sectional view of an intermediate stage of forming the semiconductor device shown along line C-C' in FIG. 5 in accordance with some embodiments.
Figure 5B:
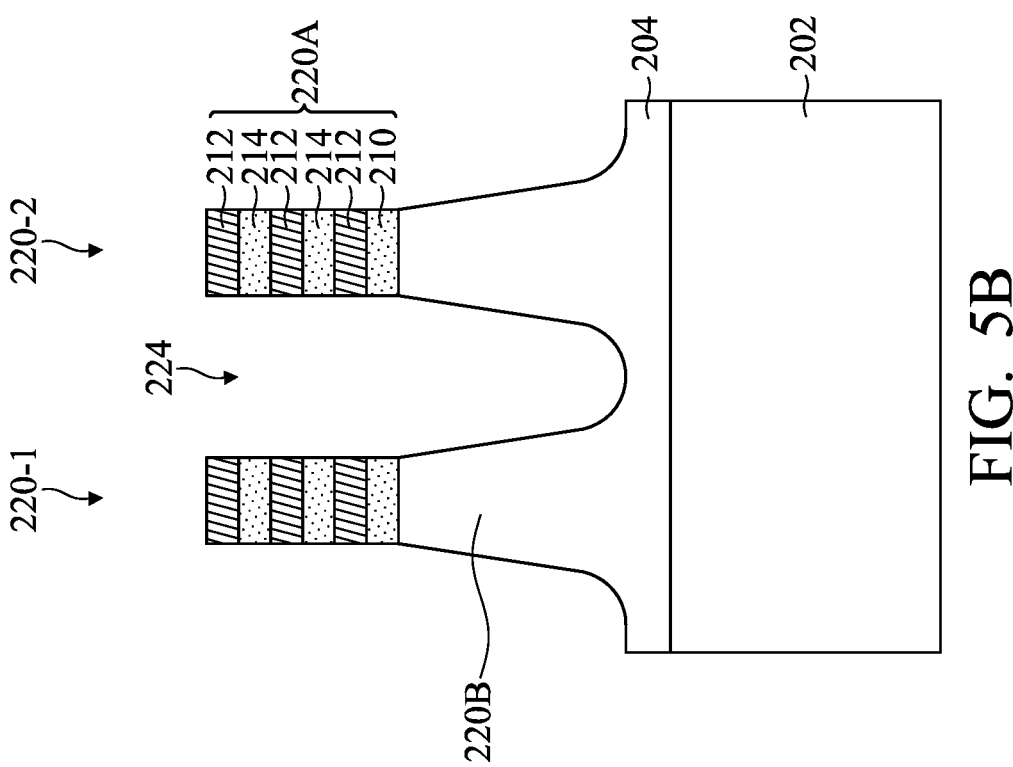
FIG. 5B illustrates a cross-sectional view of an intermediate stage of forming the semiconductor device shown along line B-B' in FIG. 5 in accordance with some embodiments.

As shown in FIGS. 5A and 5B, the trench 224 is formed through the entire alternative stack 216, the entire first sacrificial layer 210, and a portion of the middle insulator layer 204. Therefore, the middle insulator layer 204 is exposed from a bottom of the trench 224. In some embodiments, the fin structures 220-1 and 220-2 are formed by double-patterning or multi-patterning processes including several cycles of photolithography and etching processes. The etching process comprise a dry etch (e.g., reactive ion etching), a wet etch, and/or other suitable process.

As shown in FIGS. 6A-6C after forming the fin structures 220-1 and 220-2, isolation features 228 are formed on sidewalls of the base portion 220B of each of the fin structures 220-1 and 220-2. The isolation features 228 are formed around the base portion of each of the fin structures 220-1 and 220-2. In addition, top surfaces 228T of the isolation features 228 are lower than a top portion of the base portion 220B in the channel region of each of the fin structures 220-1 and 220-2. In some embodiments, the isolation feature 228 comprises silicon oxide, silicon nitride, silicon oxynitride (SiON), another suitable insulating material, or a combination thereof. In some embodiments, the isolation feature 228 is formed by performing a depositing process of an insulating material (not shown), a planarization process and a recessing process. The depositing process may be performed to form the insulating material (not shown) filling the trench 224. The depositing process may comprise thermal growth, spin-on coating, chemical vapor deposition (CVD), high density plasma CVD (HDP-CVD), physical vapor deposition (PVD), atomic layer deposition (ALD), or any other applicable deposition processes. The planarization process may be performed so that a top surface of the insulating material (not shown) is level with a top surface of each of the fin structures 220-1 and 220-2. The planarization process may comprise chemical mechanical polishing (CMP) or any other applicable planarization processes. In addition, the recessing process may be performed to recess the insulating material to form the isolation features 228. The recessing process may comprise reactive ion etching (RIE), dry etching, wet etching, or any other applicable etching processes.

As shown in FIGS. 6A-6C, next, a dummy gate structure 230 is formed on the channel regions of the fin structures 220-1 and 220-2 and extending over the isolation features 228. The dummy gate structure 230 may be used to define the source/drain regions and the channel regions of the resulting semiconductor device 500. In some embodiments, the dummy gate structure 230 comprises a dummy gate dielectric layer (not shown) and a dummy gate electrode layer (not shown) disposed over the dummy gate dielectric layer. In some embodiments, the dummy gate dielectric layer may comprise silicon oxide, silicon nitride, silicon oxynitride (SiON) or any other applicable dielectric materials, and the dummy gate electrode layer may comprise polycrystalline-silicon (poly-Si), poly-crystalline silicon-germanium (poly-SiGe) or any other applicable conductive materials. In some embodiments, the dummy gate structure 230 is formed by a deposition process and a subsequent patterning process. The patterning process is performed using a hard mask structure 232, which is s formed on the dummy gate structure 230, as a mask covering the channel region of each of the fin structures 220-1 and 220-2. In some embodiments, the hard mask structure 232 comprises multiple layers including a silicon nitride layer and a silicon oxide on the silicon nitride layer.

As shown in FIGS. 6A-6C, next, gate spacers 234 are formed on sidewalls of the dummy gate structure 230. In some embodiments, the gate spacers 234 comprises a dielectric material such as silicon oxide ($SiO_2$), silicon nitride (SiN), silicon carbide (SiC), silicon oxynitride (SiON), silicon carbon nitride (SiCN), silicon oxide carbonitride (SiOCN), or any other applicable dielectric materials. In some embodiments, the gate spacers 234 are conformally formed by a deposition process and a subsequent etching back process. The deposition process may be performed to form the dielectric material over a top surface and the sidewalls of the dummy gate structure 230. The deposition process may comprise chemical vapor deposition (CVD), flowable chemical vapor deposition, subatmospheric chemical vapor deposition (SACVD), physical vapor deposition (PVD), atomic layer deposition (ALD), or any other applicable deposition processes. The etching back process may be performed to remove a portion the dielectric material over the top surface of the dummy gate structure 230, thereby exposing the hard mask structure 232 and form the gate spacers 234. The etching back process may comprise wet etching, dry etching or a combination thereof.

As shown in FIGS. 6B-6C, next, portions of the fin structures 220-1 and 220-2 are removed until the middle insulator layer 204 is exposed to form source/drain recesses 236 in the source/drain regions of each of the fin structures 220-1 and 220-2. The upper portion 220A and a top portion of the base portion 220B in the source/drain regions of each of the fin structures 220-1 and 220-2 are anisotropically etched by an anisotropically etching process using the dummy gate structure 230 and the gate spacers 234 as an etch mask. The source/drain recesses 236 may be formed extending into the base portion 220B below the top surface 228T of the isolation feature 228. In some other embodiments, the anisotropically etching process only removes the upper portion 220A and stops on the base portion 220B in the source/drain regions of each of the fin structures 220-1 and 220-2. Therefore, the source/drain recesses 236 may not be formed extending below the top surface 228T of the isolation feature 228. The middle insulator layer 204 in the source/drain regions is exposed by the source/drain recesses 236. In some embodiments, the anisotropically etching process comprises dry etching.

As shown in FIG. 6C, next, the first sacrificial layer 210 and the second sacrificial layers 214 exposed by the source/drain recesses 236 are laterally and partially removed to form recesses (not shown) by an etching process. During the etching process, the first sacrificial layer 210 and the second sacrificial layers 214 may have a greater etching rate than the channel layers 212. In some embodiments, the etching process may be a wet etching process, a dry etching process, or a combination thereof.

As shown in FIG. 6C, after forming the source/drain recesses 236 and the recesses (not shown), inner spacers 238 are formed on lateral ends of the first sacrificial layer 210 and the second sacrificial layers 212. The inner spacers 238 formed on lateral ends of the first sacrificial layer 210 are in contact with the middle insulator layer 204. The inner spacers 238 are formed between and in contact with the channel layers 210 vertically adjacent to each other. In addition, the inner spacers 238 in contact with the middle insulator layer 204 of the SOI substrate 200 are in contact with the bottommost layer of the channel layers 212. In some embodiments, the inner spacers 238 comprises dielectric materials such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the inner spacers 238 are formed by a deposition process of a dielectric material (not shown) and a subsequent etching back process. The deposition process may be performed to fill the recesses with the dielectric material. In some embodiments, the deposition process comprises ALD or any other suitable method. The etching back process may be performed to partially remove the insulating layer from outside of the recesses, thereby forming the inner spacers 238.

As shown in FIGS. 6B-6C, next, epitaxial source/drain structures 240 are formed in the source/drain recesses 236. The epitaxial source/drain structures 240 are connected to the channel layers 212. A bottom portion 240B of the epitaxial source/drain structure 240 is in contact with the middle insulator layer 204 of the SOI substrate 200. In addition, the epitaxial source/drain structure 240 is isolated from the bottom substrate layer 202 of the substrate by the middle insulator layer 204. The topmost layer of the channel layers 212 and the top surface 228T of the isolation features 228 are positioned vertically between a top portion 240T and the bottom portion 240B of the epitaxial source/drain structure 240. Because the top semiconductor layer 206 (FIGS. 1 and 1A) of the SOI substrate 200 is transformed into the first sacrificial layer 210 and removed in the source/drain regions of each of the fin structures 220-1 and 220-2 in the previously described processes, and the lateral ends of the first sacrificial layers 210 in the channel region are covered by the inner spacers 238, the subsequently formed epitaxial source/drain structure 240 would not be in contact with any semiconductor layer above the middle insulator layer 204 of the SOI substrate 200 except for the channel layers 212. The substrate leakage of the resulting semiconductor device 500 can be eliminated.

In some embodiments, the epitaxial source/drain structures 240 comprise epitaxial semiconductor materials in-situ or ex-situ doped with an n-type dopant or a p-type dopant. For example, the epitaxial source/drain structures 240 may comprise silicon (Si) doped with phosphorous (P) for forming epitaxial source/drain structures for an n-type semiconductor device (e.g. an n-type GAA transistor). For example, the epitaxial source/drain structures 240 may comprise silicon-germanium (SiGe) doped with boron for forming epitaxial source/drain structures for a p-type device (e.g. a p-type GAA transistor). In some embodiments, the epitaxial source/drain structures 240 are epitaxially grown only from the channel layers 212 by an epitaxial growth process includes molecular beam epitaxy (MBE), metal organic chemical vapor deposition (MOCVD), vapor phase epitaxy (VPE), or other applicable epitaxial growth processes.

As shown in FIGS. 7A-7C, next, a contact etch stop layer (CESL) (not shown) an interlayer dielectric (ILD) layer 242 are formed on the epitaxial source/drain structures 240 and the isolation features 228. In some embodiments, the CESL layer comprises silicon nitride, silicon nitride, silicon oxynitride, other applicable dielectric materials, or a combination thereof. In some embodiments, the CESL layer is formed by chemical vapor deposition (CVD), physical vapor deposition, (PVD), atomic layer deposition (ALD) or other applicable deposition processes. In some embodiments, the ILD layer 242 comprises borophosphosilicate glass (BPSG), fused silica glass (FSG), phosphosilicate glass (PSG), boron doped silicon glass (BSG), tetraethylorthosilicate (TEOS) oxide, and/or other applicable dielectric materials In some embodiments, the ILD layer 242 is formed by chemical vapor deposition (CVD), physical vapor deposition, (PVD), atomic layer deposition (ALD) or other applicable deposition processes. After forming the CESL layer and the ILD layer 242, a planarization process may be performed until the top surface of the dummy gate structure 230 is exposed. The planarization process may comprise chemical mechanical polishing (CMP), etching back or a combination thereof.

As shown in FIGS. 7A-7C, after forming epitaxial source/drain structures 240, the dummy gate structure 230, the first sacrificial layer 210 and the second sacrificial layers 214 are selectively removed to expose the channel layers 212 in the channel region. In addition, a trench (not shown) between the gate spacers 234 is formed. In some embodiments, a first etch selectivity between the first sacrificial layer 210 and the channel layers 212 is the same as a second etch selectivity between the second sacrificial layer 214 and the channel layers 212 during the selective removal of the first sacrificial layer 210 and the second sacrificial layers 214. Therefore, the first sacrificial layer 210 and the second sacrificial layers 214 may be simultaneously removed from the channel layers 212. Further, the dummy gate structure 230, the first sacrificial layer 210 and the second sacrificial layers 214 are selectively removed without damaging the channel layers 212 and the gate spacers 234. After removing the first sacrificial layer 210, the top surface 204T of the middle insulator layer 204, which is away from the bottom substrate layer 202, may serve as a top surface of a resulting substrate 200R. In some embodiments, the dummy gate structure 230, the first sacrificial layer 210 and the second sacrificial layers 214 are selectively removed by a selective etching process may be a selective wet etching process, a selective dry etching process, or a combination thereof.

As shown in FIGS. 7A-7C, next, a gate structure 250 is formed wrapping the channel layers 212, thereby forming the resulting fin structures 220-1R and 220-2R. In addition, the gate structure 250 is formed filling the trench (not shown) between the gate spacers 234. In some embodiments, each of the fin structures 220-1R and 220-2R comprises the gate structure 250 and channel layers 212 wrapped by the gate structure 250. Because the first sacrificial layer 210 and the second sacrificial layers 214 may have the same thickness (the first thickness T1 of the first sacrificial layer 210 and the second thickness T2 of the second sacrificial layers 214 shown in FIG. 4A), a first distance D1 between the bottommost layer of the channel layers 212 and the top surface 204T of the middle insulator layer 204 may be the same as a second distance D2 between the bottommost layer of the channel layers 212 and the adjacent channel layer 212 opposite the middle insulator layer 204. In other words, a first portion (e.g. the bottom portion 250B of the gate structure 250) of the gate structure 250 between the bottommost layer of the channel layers 212 and the top surface 204T of the middle insulator layer 204 has a first thickness (which is the same as the first distance D1), a second portion 250S of the gate structure 250 between the bottommost layer of the channel layers 212 and the adjacent channel layer 212 opposite the middle insulator layer 204 has a second thickness (which is the same as the second distance D2). The second thickness is the same as the first thickness. In addition, the inner spacers 238 are disposed on lateral ends of the gate structure 250. The inner spacers 238 on the bottom portion 250B of the gate structure 250 are in contact with the middle insulator layer 204 of the substrate 200R. In some embodiments, each of the fin structures 220-1R and 220-2R comprises the base portion 220B under the gate structure 250 and the channel layers 212. The base portion 220B is also connected to the gate structure 250. In some embodiments, the gate structure 250 may be isolated from the bottom substrate layer 202 of the substrate 200R by the middle insulator layer 204. Therefore, the substrate leakage of the resulting semiconductor device 500 can be eliminated.

In some embodiments, the gate structure 250 comprises a gate dielectric layer (not shown) wrapping the channel layers 212 and a gate electrode layer (not shown) formed on the gate dielectric layer in the channel region. In some embodiments, the gate dielectric layer comprises silicon oxide, silicon nitride, or high-k dielectric material, other applicable dielectric material or combinations thereof. In some embodiments, the gate dielectric layer is formed by chemical vapor deposition (CVD), physical vapor deposition, (PVD), atomic layer deposition (ALD) or other applicable deposition processes. In some embodiments, the gate electrode layer comprises conductive materials. In some embodiments, the gate electrode layer is formed by chemical vapor deposition (CVD), physical vapor deposition, (PVD), atomic layer deposition (ALD) or other applicable deposition processes. After performing the aforementioned processes, the semiconductor device 500 is completely formed.

In some embodiments, the semiconductor device 500 comprises the substrate 200R, the fin structures 220-1R and 220-2R and the epitaxial source/drain structure 240. The substrate 200R formed from the SOI substrate 200 comprises the bottom substrate layer 202 and the middle insulator layer 204 on the bottom substrate layer 202. The fin structures 220-1R and 220-2R are formed over the substrate 200R. Each of the fin structures 220-1R and 220-2R comprises the gate structure 250 and the channel layers 212 wrapped by the gate structure 250. The epitaxial source/drain structure 240 is connected to the channel layers 212. A bottom portion 240 of the epitaxial source/drain structure 240 is in contact with the middle insulator layer 204 of the substrate 200R. Because the top semiconductor layer 206 (FIGS. 1 and 1A) of the SOI substrate 200 is transformed into the first sacrificial layer 210 formed of the first semiconductor atoms (e.g. Si) by driving the second semiconductor atoms (e.g. Ge) from the semiconductor capping formed thereon. The first sacrificial layer 210 and the second sacrificial layers 214 formed of the first semiconductor atoms (e.g. Si) and the second semiconductor atoms (e.g. Ge) are then removed before forming the gate structure 250. The epitaxial source/drain structure 240 would not be in contact with any semiconductor layer above the middle insulator layer 204 of the substrate 200R except for the channel layers 212. In addition, the gate structure 250 may be isolated from the bottom substrate layer 202 of the substrate 200R by the middle insulator layer 204. Therefore, the substrate leakage of the resulting semiconductor device 500 can be eliminated without extra dopants implanted into bottoms of the gate structure and epitaxial source/drain structures.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a substrate comprising a substrate layer and an insulator layer on the substrate layer;
a fin structure formed over the substrate, wherein the fin structure comprises a gate structure and channel layers wrapped by the gate structure, wherein the fin structure comprises a base portion under the gate structure and the channel layers, wherein the base portion is formed of the insulator layer of the substrate;
an epitaxial source/drain structure connected to the channel layers, wherein a bottom portion of the epitaxial source/drain structure is in contact with the insulator layer of the substrate; and
an isolation feature formed on sidewalls of the base portion.

2. The semiconductor device as claimed in claim 1, wherein a bottom portion of the gate structure is contact with the insulator layer of the substrate.

3. The semiconductor device as claimed in claim 1, wherein the epitaxial source/drain structure is isolated from the substrate layer of the substrate by the insulator layer.

4. The semiconductor device as claimed in claim 1, wherein the insulator layer is formed entirely covering a top surface of the substrate layer of the substrate, such that a top surface of the insulator layer serves as a top surface of the substrate.

5. The semiconductor device as claimed in claim 4, wherein a first distance between a bottommost layer of the channel layers and the top surface of the insulator layer is the same as a second distance between the bottommost layer of the channel layers and the adjacent channel layer opposite the insulator layer.

6. The semiconductor device as claimed in claim 2, further comprising:
inner spacers disposed on lateral ends of the gate structure, wherein the inner spacer in contact with the bottom portion of the gate structure is in contact with the insulator layer of the substrate.

7. The semiconductor device as claimed in claim 6, wherein the inner spacers are disposed between and in contact with the channel layers vertically adjacent to each other.

8. The semiconductor device as claimed in claim 6, wherein the inner spacers in contact with the insulator layer of the substrate are in contact with a bottommost layer of the channel layers.

9. The semiconductor device as claimed in claim 1, wherein the bottom portion of the epitaxial source/drain structure is in contact with the isolation feature.

10. A semiconductor device, comprising:
a substrate comprising a substrate layer and an insulator layer on the substrate layer;
a fin structure formed over the substrate, wherein the fin structure comprises a gate structure and channel layers wrapped by the gate structure, wherein the fin structure comprises a base portion in contact with a bottom portion of the gate structure, wherein the base portion is formed of the insulator layer of the substrate;

an epitaxial source/drain structure connected to the channel layers, wherein the epitaxial source/drain structure is isolated from the substrate layer of the substrate by the insulator layer; and an isolation feature formed around the base portion of the fin structure.

11. The semiconductor device as claimed in claim 10, wherein the gate structure is isolated from the substrate layer of the substrate by the insulator layer.

12. The semiconductor device as claimed in claim 10, wherein a bottom portion of the epitaxial source/drain structure is in contact with the insulator layer of the substrate.

13. The semiconductor device as claimed in claim 10, wherein a top surface of the insulator layer away from the substrate layer serves as a top surface of the substrate.

14. The semiconductor device as claimed in claim 13, wherein a first portion of the gate structure between a bottommost layer of the channel layers and the top surface of the insulator layer has a first thickness, a second portion of the gate structure between the bottommost layer of the channel layers and the adjacent channel layer opposite the insulator layer has a second thickness, wherein the second thickness is the same as the first thickness.

15. The semiconductor device as claimed in claim 10, further comprising:

inner spacers disposed on lateral ends of the gate structure, wherein the inner spacers on a bottom portion of the gate structure are in contact with the insulator layer of the substrate.

16. The semiconductor device as claimed in claim 15, wherein the inner spacers are disposed between and in contact with the channel layers vertically adjacent to each other.

17. The semiconductor device as claimed in claim 15, wherein the inner spacers on the bottom portion of the gate structure are in contact with a bottommost layer of the channel layers.

18. The semiconductor device as claimed in claim 10, wherein the bottom portion of the epitaxial source/drain structure is in contact with the isolation feature.

19. The method for forming a semiconductor device, comprising:

providing a semiconductor-on-insulator (SOI) substrate comprising a bottom substrate layer, a middle insulator layer and a top semiconductor layer containing first semiconductor atoms;

epitaxially growing a semiconductor capping layer on the top semiconductor layer, wherein the semiconductor capping layer contains the first semiconductor atoms and second semiconductor atoms that are different from the first semiconductor atoms;

performing a thermal process to drive second semiconductor atoms of the semiconductor capping layer into the top semiconductor layer so that the semiconductor capping layer and the top semiconductor layer collectively form a first sacrificial layer;

epitaxially growing an alternative stack of channel layers and second sacrificial layers on the first sacrificial layer;

patterning the middle insulator layer, the top semiconductor layer, the first sacrificial layer, and the alternative stack to form a fin structure;

forming an isolation feature on sidewalls of a base portion of the fin structure after forming the fin structure, wherein the base portion is formed of the middle insulator layer of the SOI substrate;

removing portions of the fin structure until the middle insulator layer is exposed to form source/drain recesses;

forming epitaxial source/drain structures in the source/drain recesses;

selectively removing the first sacrificial layer and the second sacrificial layers after forming the epitaxial source/drain structures; and forming a gate structure wrapping the channel layers.

20. The method for forming a semiconductor device as claimed in claim 19, wherein a first concentration of second semiconductor atoms in the semiconductor capping layer is greater than a second concentration of second semiconductor atoms in the first sacrificial layer.

21. The method for forming a semiconductor device as claimed in claim 19, wherein the channel layers contain the first semiconductor atoms but not the second semiconductor atoms.

22. The method for forming a semiconductor device as claimed in claim 19, wherein the second sacrificial layers contain the first semiconductor atoms and the second semiconductor atoms.

23. The method for forming a semiconductor device as claimed in claim 19, wherein the first sacrificial layer has a first composition and the second sacrificial layers have a second composition, wherein the second composition is the same as the first composition.

24. The method for forming a semiconductor device as claimed in claim 19, wherein the first sacrificial layer has a first thickness and the second sacrificial layers have a second thickness, wherein the second thickness is the same as the first thickness.

25. The method for forming a semiconductor device as claimed in claim 23, wherein the channel layers have a third composition, and the third composition is different from the first composition and the second composition.

26. The method for forming a semiconductor device as claimed in claim 19, wherein a bottommost layer of the channel layers is in contact with the first sacrificial layer after epitaxially growing the alternative stack of the channel layers and the second sacrificial layers.

27. The method for forming a semiconductor device as claimed in claim 19, wherein the alternative stack comprises a first number of channel layers and a second number of second sacrificial layers, and the first number is different from the second number.

28. The method for forming a semiconductor device as claimed in claim 19, wherein the first number is greater than the second number.

29. The method for forming a semiconductor device as claimed in claim 19, further comprising:

forming inner spacers on lateral ends of the first sacrificial layer and the second sacrificial layers after forming the source/drain recesses.

30. The method for forming a semiconductor device as claimed in claim 29, wherein the inner spacer on lateral ends of the first sacrificial layer is in contact with the middle insulator layer.

31. The method for forming a semiconductor device as claimed in claim 19, wherein a first etch selectivity between the first sacrificial layer and the channel layers is the same as a second etch selectivity between the second sacrificial layer and the channel layers during the selective removal of the first sacrificial layer and the second sacrificial layers.

* * * * *